(12) United States Patent
Higuchi

(10) Patent No.: US 6,385,391 B1
(45) Date of Patent: May 7, 2002

(54) VIDEO TAPE REPRODUCING APPARATUS

(75) Inventor: Yoshio Higuchi, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 0 days.

(21) Appl. No.: 09/220,489

(22) Filed: Dec. 24, 1998

(30) Foreign Application Priority Data

Dec. 27, 1997 (JP) .............................................. 9-011797

(51) Int. Cl.[7] .............................................. H04N 5/91
(52) U.S. Cl. ........................ 386/100; 386/115; 386/96
(58) Field of Search .............................. 386/1, 39, 46, 386/57, 58, 69, 96, 81, 114, 115, 100; 360/67, 27; H04N 5/91

(56) References Cited

U.S. PATENT DOCUMENTS

| | | | | |
|---|---|---|---|---|
| 5,172,239 A | * | 12/1992 | Nakayama et al. ............ | 386/1 |
| 5,398,138 A | * | 3/1995 | Tomita ......................... | 386/96 |
| 5,428,455 A | * | 6/1995 | Hosoya et al. ............... | 386/114 |
| 5,486,931 A | * | 1/1996 | Kim et al. ..................... | 386/81 |
| 5,870,239 A | * | 2/1999 | Furuya ......................... | 386/115 |
| 6,038,372 A | * | 3/2000 | Jeon ............................. | 386/115 |

* cited by examiner

Primary Examiner—Vincent F. Boccio
(74) Attorney, Agent, or Firm—Lackenbach Siegel, LLP

(57) ABSTRACT

In a video tape reproducing apparatus, there is provided an integrated circuit in which an audio signal amplifier for amplifying an audio signal reproduced by a fixed type audio head, and a control signal amplifier for amplifying a control signal reproduced by a fixed type control head are integrated with each other.

12 Claims, 3 Drawing Sheets

VIDEO TAPE REPRODUCING APPARATUS

BACKGROUND OF THE INVENTION

1. Field of the Invention

The present invention relates to a video tape reproducing apparatus having an integrated circuit in which an amplifier for amplifying an output of an audio head and an amplifier for amplifying an output of a control head are integrated with each other.

2. Description of the Related Art

A fixed type audio head for reproducing an audio signal recorded on a video tape and a control head for reproducing a control signal are integrated into one head in response to requirements for easiness of attachment and reduction of size. FIG. 4 shows an example of the integrated head. In FIG. 4, reference numeral 3 designates a control head; and 4, an audio head. Both a control signal reproduced by the control head 3 and an audio signal reproduced by the audio head 4 are led to a signal processing board 52 through a connector 51. The audio signal led to the board 52 through the connector 51 is led to an integrated circuit 55 containing an audio signal amplifier so as to be amplified therein. The control signal led to the board 52 through the connector 51 is led to an integrated circuit 56 containing a control signal amplifier and the like so as to be processed therein.

In the aforementioned configuration, however, a problem arises as follows. That is, the integrated circuit 55 containing the audio signal amplifier is formed as a multifunctional integrated circuit containing luminance signal and chrominance signal processing circuits and the like. Further, the integrated circuit 56 containing the control signal amplifier and the like is similarly formed also as a multifunctional integrated circuit in which a microcomputer for controlling the operation of the apparatus and the like are integrated. Accordingly, each of the integrated circuits 55 and 56 has a large number of pins, so that a very large number of patterns are necessarily arranged in the periphery of each of the integrated circuits 55 and 56. Further, it is very difficult, also in terms of the arrangement of other signal processing circuits, to form such patterns even though the integrated circuits 55 and 56 are intended to be provided in proximity to each other. Accordingly, the integrated circuits 55 and 56 must be provided so as to be far from each other. As a result, when the integrated circuit 55 is arranged in proximity to the connector 51 to give preference to shortening of audio signal patterns, the integrated circuit 56 is provided necessarily so as to be far from the connector 51. Accordingly, patterns 57 and 58 for leading the control signal to the integrated circuit 56 become necessarily long-path patterns.

On the other hand, both the audio signal reproduced by the audio head 4 and the control signal reproduced by the control head 3 are micro-level signals in which the signal-to-noise ratio (S/N) is apt to be worsened by the influence of ambient noise. The patterns for leading the control signal to the integrated circuit 56, however, must be provided as long patterns in terms of the arrangement of the integrated circuit 56. Therefore, the hot-level pattern 57 and the cold-level pattern 58 are arranged adjacently to each other as the patterns for the control signal to thereby eliminate the influence of common-mode noise. However, even in the case where such pattern lines making a pair are used, the S/N of the control signal is apt to be worsened because the patterns are long. Accordingly, consideration, for example, of arranging the patterns 57 and 58 away from digital pulse transmission patterns is required. This is a large limitation on formation of patterns.

SUMMARY OF THE INVENTION

The present invention has been made to solve the aforementioned problem and an object thereof is to provide a video tape reproducing apparatus in which the patterns for micro-level signals can be formed easily.

In order to achieve the above object, according to the present invention, there is provided a video tape reproducing apparatus comprising: a fixed audio head for reproducing an audio signal recorded on a video tape; a fixed control head for reproducing a control signal recorded on the video tape; and an integrated circuit in which an audio signal amplifier for amplifying the audio signal reproduced by the audio head, and a control signal amplifier for amplifying the control signal reproduced by the control head are integrated with each other.

Thus, by simply providing the connection between the audio head and a board and the connection between the control head and the board in proximity to one integrated circuit, both the pattern for the audio signal from the audio head and the pattern for the control signal from the control head become short necessarily. As a result, both the patterns are substantially free from the influence of ambient noise.

DETAILED DESCRIPTION OF THE PREFERRED EMBODIMENT

An embodiment of the present invention will be described below with reference to the drawings.

Figure 1:
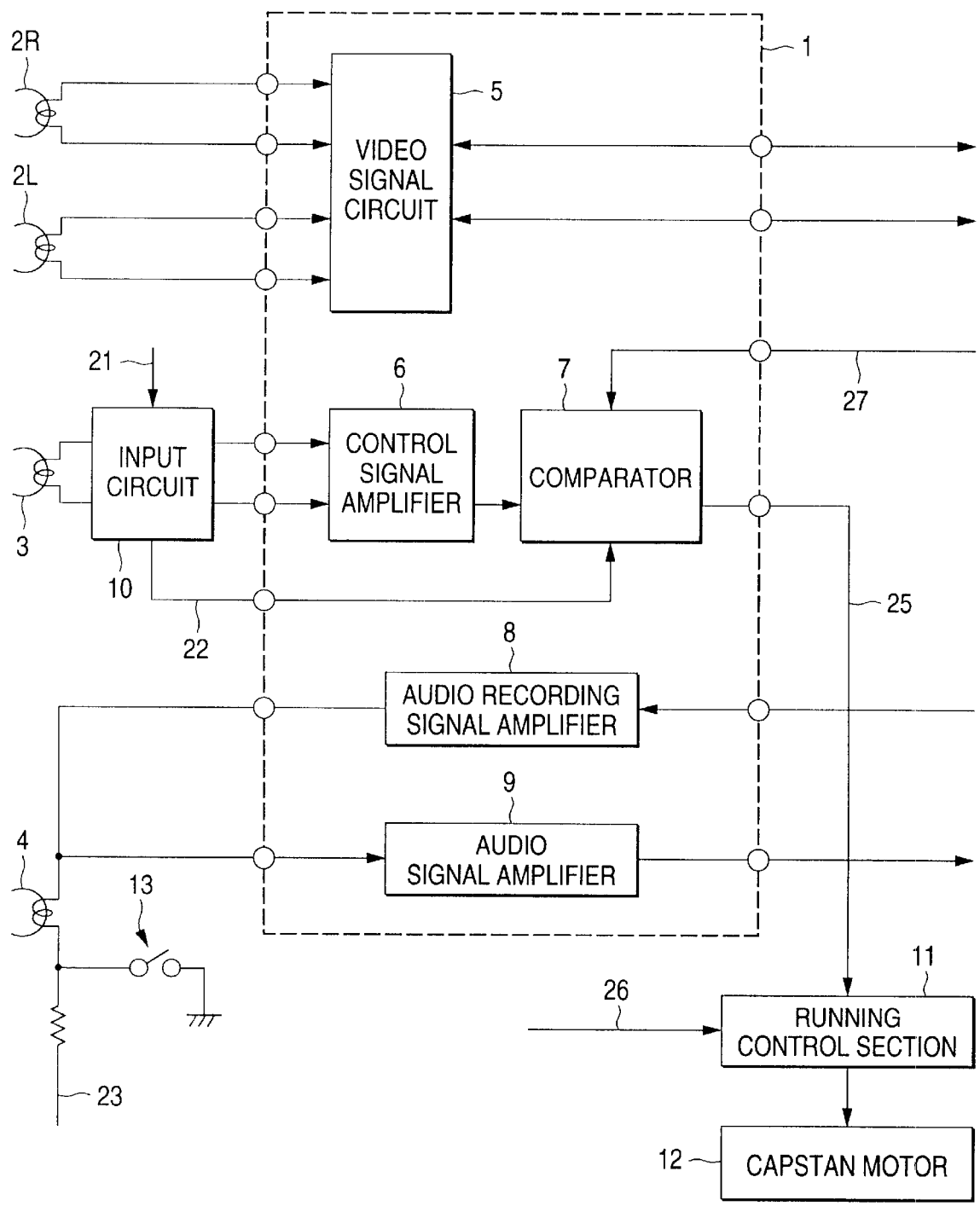
FIG. 1 is a block diagram showing the electrical configuration of a video tape reproducing apparatus (video cassette deck) according to an embodiment of the present invention.

FIG. 1 is a block diagram showing the electrical configuration of a video tape reproducing apparatus according to the embodiment of the present invention and specifically showing a video cassette deck having also a video recording function.

In FIG. 1, an integrated circuit 1 is designed such that circuits for processing signals relevant to heads are integrated into an integrated circuit. That is, a video signal circuit 5, a control signal amplifier 6, a comparator 7, an audio recording signal amplifier 8 and an audio signal amplifier 9 are integrated into the integrated circuit 1.

The video signal circuit 5 is a circuit for processing a video signal reproduced by rotary heads 2R and 2L. That is, a luminance signal is reproduced from an FM luminance signal in the video signal reproduced by the rotary heads 2R and 2L. Further, a chrominance signal is reproduced from a low-band-converted chrominance signal in the video signal. The luminance and chrominance signals thus reproduced are supplied to the outside. On the other hand, an FM luminance signal is generated on the basis of a luminance signal given from the outside and a lowband-converted chrominance signal is generated on the basis of a chrominance signal given from the outside. The FM luminance and low-band-converted chrominance signals thus generated are supplied to the rotary heads 2R and 2L.

Although this embodiment has the configuration in which the apparatus has not only the rotary heads 2R and 2L for performing standard video recording/reproducing but also rotary heads for performing long-time video recording/reproducing, the rotary heads for performing long-time video recording/reproducing are not shown in FIG. 1.

The control signal amplifier 6 is an amplifier for amplifying a control signal which is reproduced by a control head 3 and led thereto through an input circuit 10. The comparator 7 performs two-valuing or binarizing of the control signal amplified by the control signal amplifier 6 to thereby generate control pulses indicating the timing of running of the video tape. The control pulses (output 25) thus generated are supplied to a running control section 11. The respective configurations of the input circuit 10, control signal amplifier 6 and comparator 7 and signal lines 21, 22 and 27 will be described later in detail.

The audio recording signal amplifier 8 is provided as a block for equalizing and amplifying an audio signal given from the outside of the integrated circuit 1. A recording signal thus obtained by equalization and amplification is supplied to an audio head 4. The audio signal amplifier 9 is provided as a block for equalizing and amplifying an audio signal reproduced by the audio head 4. The audio signal thus obtained by equalization and amplification is supplied, as a reproduced audio signal, to the outside of the integrated circuit 1.

A signal line 23 is provided as a signal path through which a bias signal is led at the time of recording an audio signal.

A switch 13 is formed so that connection is controlled by a control section not shown. That is, the switch 13 is opened at the time of audio recording and closed at the time of audio reproducing. Accordingly, the bias signal is given to the audio head 4 at the time of audio recording.

The running control section 11 is provided as a block which contains, as a main component, a software unit executed by a microcomputer. The running control section 11 controls the rotation of a capstan motor 12 which makes the video tape run. That is, the phase of a control pulse (output 25) from the comparator 7 is compared with that of a reference pulse 26. The capstan motor 12 is driven on the basis of a result of the comparison to thereby make the video tape run in a phase relation in accordance with the rotation of the rotary heads 2R and 2L.

Figure 2:
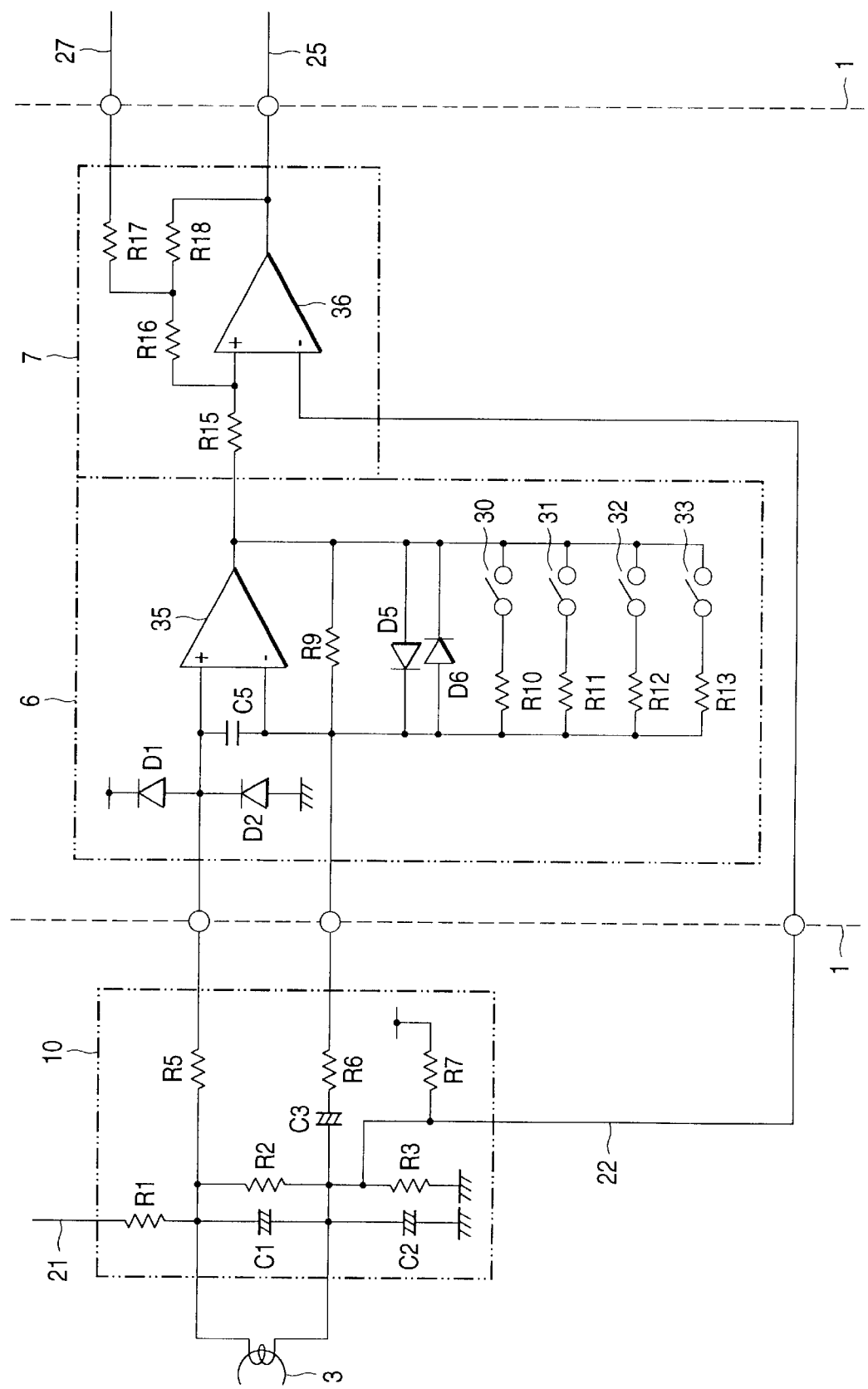
FIG. 2 is a circuit diagram showing the detailed electrical connection of an input circuit, a control signal amplifier and a comparator in the apparatus shown in FIG. 1.

FIG. 2 is a circuit diagram showing the detailed electrical connection of the input circuit 10, control signal amplifier 6 and comparator 7.

The input circuit 10 provided for leading the output of the control head 3 to the control signal amplifier 6 is composed of six resistors R1 to R3 and R5 to R7, and three capacitors C1 to C3. That is, the capacitor C1 and the resistor R2 connected in parallel to the control head 3 are elements for matching with impedance of the control head 3. The signal line 21 in which recording control pulses appear, is connected to one terminal of the control head 3 through the resistor R1. The output of a voltage divider constituted by the resistors R3 and R7 is applied to the other terminal of the control head 3. The capacitor C2 connected between the other terminal of the control head 3 and the ground level serves to reduce the output impedance of the divided voltage and also to connect the other terminal of the control head 3 to the ground in terms of alternating current.

The resistor R5 having one terminal connected to one terminal of the control head 3 serves as an element by which the value of an abnormal current generated when an abnormal voltage is induced in a signal path from the control head 3 is limited to be not larger than a predetermined value. A series circuit composed of the capacitor C3 and the resistor R6 and having one terminal connected to the other terminal of the control head 3 serves as a circuit for determining the amplification factor of the control signal amplifier 6 provided in the integrated circuit 1.

The control signal amplifier 6 is composed of four diodes D1, D2, D5 and D6, five resistors R9 to R13, a capacitor C5, four switches 30 to 33, and an operational amplifier 35. That is, the diodes D1 and D2 serve as elements by which an abnormal voltage induced in a signal path led through the resistor R5 is limited to be smaller than the power source voltage to thereby protect the integrated circuit 1 from being destroyed. The capacitor C5 connected between the plus- and minus-input terminals of the operational amplifier 35 serves as an element for absorbing an abnormal voltage produced by high-frequency induction.

The resistor R9 connected between the output terminal and the minus-input terminal of the operational amplifier 35 serves as an element which makes a pair with the resistor R6 so that the amplification factor of the operational amplifier 35 is determined when all the four switches 30 to 33 are opened. A pair of diodes D5 and D6 connected in parallel with the resistor R9 and in directions reverse to each other serve as elements by which the amplification factor of the operational amplifier 35 is made to approach 1 to prevent the saturation of the operational amplifier 35 when the output level of the operational amplifier 35 exceeds the forward voltage.

A circuit composed of the resistors R10 to R13, and the switches 30 to 33 connected in series to the resistors R10 to R13 respectively serves as a circuit for setting the amplification factor of the operational amplifier 35 to a predetermined value when the switches 30 to 33 are controlled to be closed/opened individually. Therefore, the switches 30 to 33 are controlled by a control section (not shown) provided in the outside of the integrated circuit 1 so that the switches 30 to 33 are closed/opened individually.

In detail, the connection of the switch 30 is switched between the standard-playing mode and the long-playing mode. In the standard-playing mode, the switch 30 is closed in order to reduce the amplification factor of the operational amplifier 35.

The switch 31 reduces the amplification factor of the operational amplifier 35 in the search mode. The switches 32 and 33 are closed in the fast feed/rewinding. The switches 32 and 33 are closed in accordance with the fast feed/rewinding speed.

The comparator 7 for binarizing the control signal amplified by the control signal amplifier 6 is composed of four resistors R15 to R18, and an operational amplifier 36. That is, a series circuit composed of the resistors R16 and R18 is connected between the plus-input terminal and the output terminal of the operational amplifier 36 in order to provide positive feedback. Accordingly, the resistor R15 connected between the output terminal of the operational amplifier 35 in the control signal amplifier 6 and the plus-input terminal of the operational amplifier 36 in the comparator 7 makes a pair with the series circuit composed of the resistors R16 and R18 to thereby provide hysteresis to the operational amplifier 36.

A signal line 27 serves as a signal line of which the level becomes high or low in accordance with the way of running of the video tape in a slow mode and which is opened in other modes. Accordingly, when the signal line 27 is opened, the slice level which is a reference value for comparison on the operational amplifier 36 takes a value which is obtained when the hysteresis value is added to/subtracted from the divided voltage (signal line 22) indicating a reference level of the control signal. When the signal line 27 takes an H level or an L level, the level of the plus input of the operational amplifier 36 shifts in accordance with the ratio of the resistors R16 to R18 so that the slice level changes in accordance with the shift quantity.

Figure 3:
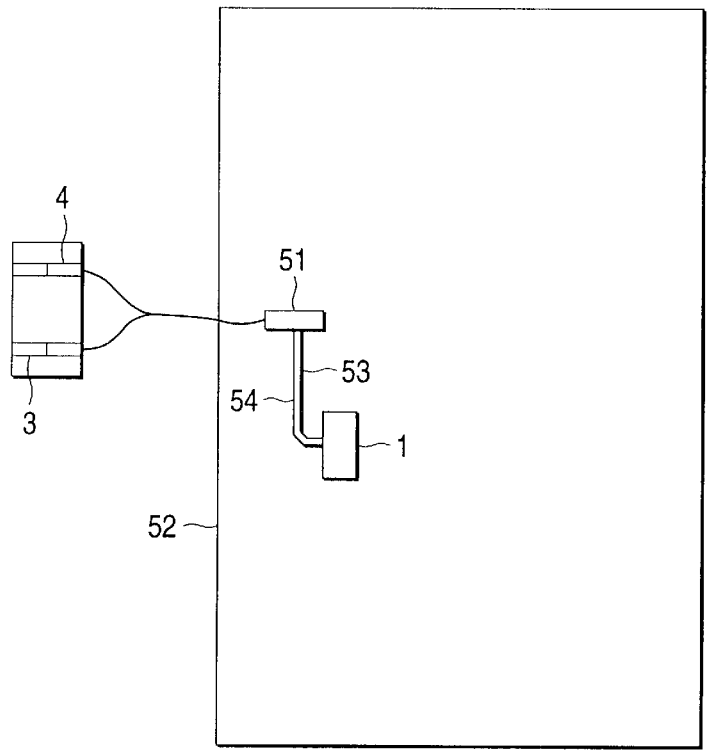
FIG. 3 is an explanatory diagram showing the outline of a board provided with an integrated circuit.
Figure 4:
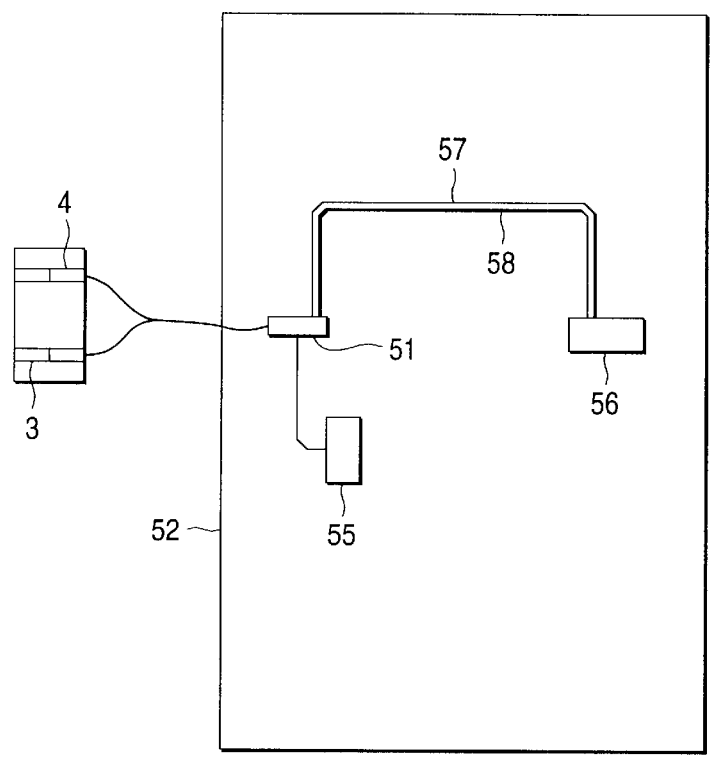
FIG. 4 is an explanatory diagram showing the outline of a conventional board.

FIG. 3 is an explanatory diagram showing the outline of a board on which the integrated circuit 1 is provided.

Each of the control head 3 and audio head 4 described above is of a fixed type. As shown in FIG. 3, the two heads 3 and 4 are integrated into one head for the purpose of reducing the size and making the head attachment easy. Further, both the control head 3 and the audio head 4 are electrically connected, through one connector 51, to the board 52 on which the integrated circuit 1 is provided. On the other hand, the integrated circuit 1 is provided in proximity to the connector 51. Accordingly, both a pattern 53 for connecting the control head 3 to the integrated circuit 1 and a pattern 54 for connecting the audio head 4 to the integrated circuit 1 are short. Further, the patterns 53 and 54 are provided in proximity to each other and in parallel with each other. Accordingly, the area to which patterns producing large noise such as digital pulse transmission patterns or the like must be kept at a distance, is only the periphery of the patterns 53 and 54. For the patterns 53 and 54, one pattern serves as a micro-level signal pattern, so that it is sufficient for the one pattern to take only the influence of noise produced from the other pattern into consideration. Accordingly, the patterns can be designed extremely easily.

Incidentally, the input circuit 10 constituted by discrete elements is not shown in FIG. 3. Although the control head 3 is connected to the integrated circuit 1 by a pair of signal lines, only the pattern 53 corresponding to one of the pair of signal lines is shown in FIG. 3 and the pattern corresponding to the other signal line is not shown in FIG. 3.

The operation of the apparatus of the embodiment configured as described above will be described below.

The respective connections of the switches 30 to 33 are controlled in accordance with the classification of the operation such as "normal play", "special play", "record", "fast feed" or "rewind" and the operation mode such as "standard-playing mode" or "long-playing mode". Accordingly, the control signal amplifier 6 amplifies the control signal reproduced by the control head 3 with the amplification factor determined in accordance with the operation. In this case, the signal led to the control signal amplifier 6 becomes good in S/N even when an operation (slow reproduction in the long-playing mode) is performed in which the output level of the control head 3 is minimized, because the pattern 53 for connecting the control head 3 to the integrated circuit 1 is so short that the influence of ambient noise is little. Then, the control signal amplified by the control signal amplifier 6 is binarized by the comparator 7 to generate control pulses. The control pulses outputted from the comparator 7 are supplied as the output 25 to the running control section 11.

Accordingly, the running control section 11 controls the rotation of the capstan motor 12 while comparing the phase of the control pulses provided by the output 25 with the phase of. reference pulses provided by the signal line 26.

In the video tape reproducing apparatus according to the present invention, there is provided an integrated circuit in which an audio signal amplifier for amplifying an audio signal reproduced by a fixed type audio head, and a control signal amplifier for amplifying a control signal reproduced by a fixed type control head are integrated with each other. Thus, by simply providing the connection between the audio head and a board and the connection between the control head and the board in proximity to the integrated circuit, both the pattern for the audio signal from the audio head and the pattern for the control signal from the control head can become short necessarily. As a result, both the patterns are substantially free from the influence of ambient noise, so that the patterns for micro-level signals can be formed easily.

What is claimed is:

1. A video tape reproducing apparatus comprising:
    a fixed audio head for reproducing an audio signal recorded on a video tape;
    an integrated circuit in which an audio signal amplifier for amplifying the audio signal reproduced by said audio head, and a control signal amplifier for amplifying the control signal reproduced by said control head are integrated with each other;
    a connector for connecting said audio head and said control head to a board having said integrated circuit provided thereon;
    wherein a pattern is formed on the board for connecting said audio head to said integrated circuit and a pattern is formed on the board for connecting said control head to said integrated circuit in proximity to each other and in parallel with each other; and
    the lengths of said adjacent patterns being selected to reduce ambient noise while creating predetermined predictable cross-talk that can be more readily compensated for or minimized.

2. The video tape reproducing apparatus according to claim 1, wherein said integrated circuit contains a comparator for binarizing the control signal amplified by said control signal amplifier.

3. The video tape reproducing apparatus according to claim 2, wherein such integrated circuit contains a video signal circuit for processing a video signal reproduced by rotary heads.

4. The video tape reproducing apparatus according to claim 3 wherein the amplified control signal generates pulses to indicate the timing of running of the videotape.

5. The videotape reproducing apparatus as claimed in claim 4, composed of two parallel resistors in series with two series resistors and an operational amplifier with one of said series resistors and/or of said parallel resistors in series with each other and connected across the input and output terminal of said operational amplifier to provide a positive feedback.

6. The videotape reproducing apparatus as claimed in claim 5, wherein the other of said series resistors and said one parallel resistor provides hysteresis to said operational amplifier to provide a hysteresis value, and said two series resistors and said one parallel resistor are in series with each other.

7. The videotape reproducing apparatus according to claim 6, comprising means including said other parallel resistor and a signal line coupled therewith providing for a reference value for comparison on the operational level amplifier to take a value which is obtained when the hysteresis.

8. The video tape reproducing apparatus according to claim 2 wherein the amplified control signal generates pulses to indicate the timing of running of the videotape.

9. The videotape reproducing apparatus as claimed in claim 2, composed of two parallel resistors in series with two series resistors and an operational amplifier with one of said series resistors and/or of said parallel resistors in series with each other and connected across the input and output terminal of said operational amplifier to provide a positive feedback.

10. The videotape reproducing apparatus as claimed in claim 9, wherein the other of said series resistors and said one parallel resistor provides hysteresis to said operational amplifier to provide a hysteresis value.

11. The videotape reproducing apparatus according to claim 10, comprising means including said other parallel resistor and a signal line coupled therewith providing for a reference value for comparison on the operational level amplifier to take a value which is obtained when the hysteresis value is added to or subtracted from a divided voltage fed to the comparator indicating a reference level of the control signal.

12. The video tape reproducing apparatus according to claim 1, wherein said intergrated circuit contains a video signal circuit for processing a video signal reproduced by rotary heads.

* * * * *